(12) United States Patent
Chevallier

(10) Patent No.: US 6,795,326 B2
(45) Date of Patent: Sep. 21, 2004

(54) FLASH ARRAY IMPLEMENTATION WITH LOCAL AND GLOBAL BIT LINES

(75) Inventor: Christophe Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 322 days.

(21) Appl. No.: 10/017,664

(22) Filed: Dec. 12, 2001

(65) Prior Publication Data

US 2003/0107092 A1 Jun. 12, 2003

(51) Int. Cl.$^7$ .................................................. G11C 7/00
(52) U.S. Cl. ............... 365/63; 365/230.03; 365/230.04; 365/230.06
(58) Field of Search .............................. 365/63, 230.03, 365/230.04, 230.06

(56) References Cited

U.S. PATENT DOCUMENTS

| | | | | |
|---|---|---|---|---|
| 5,245,570 A | * | 9/1993 | Fazio et al. ............ | 365/185.13 |
| 5,526,307 A | * | 6/1996 | Yiu et al. ............... | 365/185.01 |
| 5,621,690 A | * | 4/1997 | Jungroth et al. ........... | 365/200 |
| 5,748,545 A | * | 5/1998 | Lee et al. ................... | 365/201 |
| 5,777,922 A | | 7/1998 | Choi | |
| 5,805,501 A | * | 9/1998 | Shiau et al. ........... | 365/185.29 |
| 5,825,782 A | | 10/1998 | Roohparvar | |
| 5,894,437 A | * | 4/1999 | Pellegrini .............. | 365/185.13 |
| 5,898,637 A | | 4/1999 | Lakhani et al. | |
| 5,996,106 A | | 11/1999 | Seyyedy | |
| 6,064,592 A | * | 5/2000 | Nakagawa et al. .... | 365/185.05 |
| 6,262,914 B1 | * | 7/2001 | Smayling et al. ...... | 365/185.11 |
| 6,282,145 B1 | * | 8/2001 | Tran et al. ............. | 365/230.06 |
| 6,304,504 B1 | | 10/2001 | Chevallier et al. | |
| 6,507,515 B2 | * | 1/2003 | Taniguchi .............. | 365/185.17 |
| 6,515,906 B2 | * | 2/2003 | Tedrow et al. ......... | 365/185.21 |
| 6,614,685 B2 | * | 9/2003 | Wong ..................... | 365/185.11 |
| 6,628,563 B1 | * | 9/2003 | Hsu et al. .............. | 365/230.03 |
| 6,704,222 B2 | * | 3/2004 | Guterman et al. ..... | 365/185.03 |
| 2002/0085423 A1 | * | 7/2002 | Tedrow et al. ......... | 365/185.21 |
| 2003/0090949 A1 | * | 5/2003 | Tedrow et al. .............. | 365/200 |

FOREIGN PATENT DOCUMENTS

| | | | | |
|---|---|---|---|---|
| JP | 408153856 A | * | 6/1996 | ......... H01L/27/108 |
| JP | 411096750 A | * | 4/1999 | ......... G11C/11/401 |
| JP | 02001102464 A | * | 4/2001 | ....... H01L/21/8244 |
| JP | 02002100187 A | * | 4/2002 | ........... G11C/11/41 |
| WO | WO 96/31882 | | 10/1996 | |

* cited by examiner

Primary Examiner—Viet Q. Nguyen
(74) Attorney, Agent, or Firm—Leffert Jay & Polglaze PA

(57) ABSTRACT

A flash memory device that has a global and local bit line design that enables an alternate bit line stress mode as well as a way to detect short circuits in local and global bit lines with a single alternate bit line program. The flash memory device has a plurality of sets of adjacent local bit lines, a plurality of global bit lines and a plurality of select transistors. Each select transistor has a control gate and is coupled between one of the local bit lines in each set of local bit lines and one of the global bit lines. Thus, each local bit line in each set of local bit lines is coupled to a different global bit line. Multiple select lines are used to activate the control gates on the select transistors. Each select line is coupled to the control gates on associated select transistors. The associated select transistors are select transistors that are coupled to the local bit lines in an associated set of local bit lines.

19 Claims, 8 Drawing Sheets

FLASH ARRAY IMPLEMENTATION WITH LOCAL AND GLOBAL BIT LINES

TECHNICAL FIELD OF THE INVENTION

The present invention relates generally to non-volatile memory devices and in particular the present invention relates to global and local bit line designs in synchronous non-volatile flash memory.

BACKGROUND OF THE INVENTION

Memory devices are typically provided as internal storage areas for computers. The term "memory" identifies data storage that comes in the form of integrated circuit chips. There are several different types of memory, including RAM (random-access memory). RAM is typically used as main memory in a computer environment. Most RAM is volatile, which means that it requires a steady flow of electricity to maintain its contents. As soon as the power is turned off, whatever data was in RAM is lost.

Computers can contain a small amount of read-only memory (ROM) that holds instructions for starting up the computer. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem computers have their basic I/O system (BIOS) stored on a flash memory chip so that the BIOS can easily be updated when necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into erasable blocks. Each of the memory cells can be electrically programmed in a random basis by charging its floating gate. The charge can be removed from the floating gate using a block erase operation. The data in a cell is determined by the presence or absence of the charge in the floating gate.

Semiconductor memories, including Flash memory, are commonly built using multi-layering wiring. These memories typically include hierarchical bit lines that are used to retrieve and write data into and from the memory array. The hierarchical bit lines generally include local bit lines and global bit lines. During the manufacture of a semiconductor memory on a wafer, shorts can occur between local bit lines as well as between global bit lines rendering the memory defective.

For the reasons stated above, and for other reasons stated below which will become apparent to those skilled in the art upon reading and understanding the present specification, there is a need in the art for efficiently testing a wafer for shorts in both local bit lines and global bit lines.

SUMMARY OF THE INVENTION

The above-mentioned problems with detecting bit line shorts in memory devices and other problems are addressed by the present invention and will be understood by reading and studying the following specification.

In one embodiment, the present invention provides a flash memory device that comprises, a plurality of sets of adjacent local bit lines, a plurality of global bit lines and a plurality of select transistors. Each select transistor has a control gate and is coupled between one of the local bit lines in each set of local bit lines and one of the global bit lines. Thus, each local bit line in each set of local bit lines is coupled to a different global bit line. Multiple select lines are used to activate the control gates on the select transistors. Each select line is coupled to the control gates on associated select transistors. The associated select transistors are select transistors that are coupled to the local bit lines in an associated set of local bit lines.

In another embodiment, a flash memory device comprises a plurality of sets of adjacent local bit lines, a plurality of global bit lines and a plurality of select transistors. The plurality of select transistors each have a control gate and are coupled between the plurality of sets of adjacent local bit lines and the plurality of global bit lines. Moreover, every other local bit line in one of the plurality of sets of local bit lines is coupled to a different one of the plurality of global bit lines. A plurality of select lines are used to activate the control gates on the select transistors. Each select line is coupled to the control gates on associated select transistors. The associated select transistors are select transistors that are coupled to every other global bit line.

In another embodiment, a flash memory device comprises, a plurality of local bit lines that are positioned generally parallel with each other, a plurality of select transistors and a plurality of global bit lines. Each select transistor has a control gate. Moreover, each select transistor is coupled to an associated one of the plurality of local bit line. Each global line is coupled to a pair of associated select transistors. The associated pair of select transistors are select transistors that are coupled to alternate local bit lines. In addition, the plurality of local bit lines comprise a first local bit line, a second local bit line, a third local bit and a fourth local bit line. A first select line coupled the control gates on the select transistors coupled to the first and second local bit lines. A second select line coupled to the select transistors coupled to the third and fourth local bit lines.

In another embodiment, a flash memory system comprises an array of flash memory cells, a plurality of local bit lines, a plurality of global bit lines and a select circuit. The memory cells of the array are arranged in rows and columns. The plurality of local bit lines are positioned generally parallel with each other and are coupled to an associated column of the memory array. Each global bit line is selectively coupled to a pair of associated local bit lines. The pair of associated local bit lines being the local bit lines that are alternately positioned with respect to each other. The select circuit selectively couples the local bit lines to the global bit lines. The plurality of local bit lines comprise a first local bit line, a second local bit line, a third local bit and a fourth local bit line. The select circuit comprises a select transistor for each local bit line. Each select transistor has a control gate. In addition, the flash memory system has a first select line and a second select line. The first select line is used to activate the control gates on the first and second local bit lines. The second select line is used to activate the control gates on the third and fourth local bit lines.

In another embodiment, a flash memory system comprises an array of flash memory cells, four local bit lines, a pair of global bit lines, a first multiplex circuit and a second multiplex circuit. The array of flash memory cells are arranged in rows and columns. The four local bit lines are positioned generally parallel with each other and comprise a first, second, third and fourth global bit line. Each local bit line is coupled to an associated column of flash memory cells. The first multiplex circuit is used to selectively couple a pair of associated local bit lines with an associated global bit line. The associated pair of local bit lines are local bit lines that are alternately positioned with respect to each other. The second multiplex circuit is used to selectively couple the remaining pair of local bit lines to the remaining global bit line. The associated pair of local bit lines are local bit lines that are alternately positioned with respect to each other. The first multiplex circuit includes a pair of select transistors.

One of the select transistors, in this embodiment, is coupled between the first local bit line and an associated global bit line. The other of the select transistor is coupled between the third local bit line and the associated global it line. The second multiplex circuit also includes a pair of select transistors. One of the select transistors is coupled between the second local bit line and an associated global bit line. The other select transistor is coupled between the fourth local bit line and the associated global bit line. The flash memory system also includes a first select line and a second select line. The first select line is coupled to the control gates on the select transistors that are coupled to the first and second local bit lines. The second select line coupled to the control gates on the select transistors that are coupled to the third and fourth local bit lines. In this embodiment, the array of flash memory cells is positioned between the first multiplex circuit and the second multiplex circuit.

In another embodiment, an integrated select circuit comprises, a first drain diffusion region, a second drain diffusion region laterally spaced apart from the first drain diffusion region and a source diffusion region laterally spaced between the first drain diffusion region and the second drain diffusion region. A first local bit line is coupled to the first drain diffusion region. A second local bit line is coupled to the second drain diffusion region. In addition, a global bit line is coupled to the source diffusion region. The first drain diffusion region is laterally wider than the second drain diffusion region such that a third local bit line can traverse between the first local bit line and the second local bit line. In addition, the third local bit line is generally located above the first drain diffusion region.

In another embodiment, a memory device comprising an array of memory cells coupled to even and odd local bit lines and select transistors. Some of the select transistors are coupled between even local bit lines and even global bit lines. Moreover, the rest of the select transistors are coupled between the odd local bit lines and the odd global bit lines.

A method of operating a flash memory including programming a memory array with an alternate bit line stress program, monitoring the logic states in global bit lines in response to the alternate bit line program, comparing the pattern of logic states in global bit lines with a predetermined pattern and locating local and global bit line shorts in response to the monitoring.

Another method of operating a flash memory including programming even columns of addresses of a memory array to a first logic state, programming odd columns of addresses of a memory array to an opposite logic state, monitoring the output of the memory array and detecting local bit line shorts and all global bit line shorts in response to a pattern of logic states in the global bit lines.

Another method of operating a memory system comprising, programming even columns of addresses of a memory array to a first logic state, programming odd columns of addresses of a memory array to an opposite logic state, activating control gates on select transistors, monitoring logic states in global bit lines and simultaneously determining short circuits in local and global bit lines in response to a pattern of logic states in the global bit lines.

A method of operating an integrated circuit memory comprising, selectively coupling odd local bit lines to odd global bit lines and selectively coupling even local bit lines to even global bit lines.

A method of conducting an alternative bit line stress on a flash memory. The method comprising, applying activation signals to select transistors to selectively couple global bit lines to associated local bit lines, wherein adjacent local bit lines are selectively coupled to different global bit lines and applying potential voltage differences across adjacent global bit lines.

Another method of conducting an alternative bit line stress on a flash memory. The method comprising, selectively coupling a first local bit line to a first global bit line, selectively coupling a second local bit line to a second global bit line, selectively coupling a third local bit line to the first global bit line, selectively coupling a fourth local bit line to the second global bit line and applying a voltage potential across the first and second global bit lines.

DETAILED DESCRIPTION OF THE INVENTION

Figure 1:
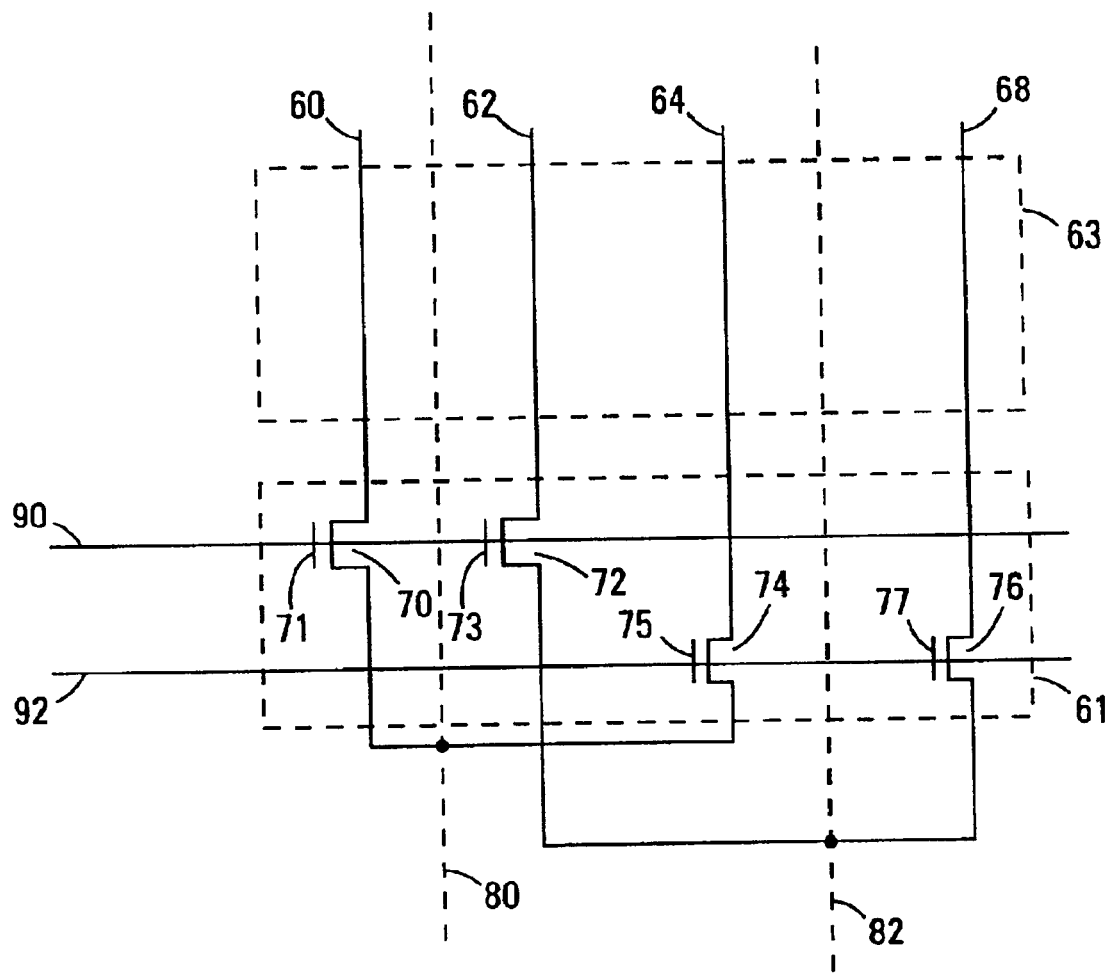
FIGS. 1 and 1A are illustrations of the local and global bit line design of one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

A semiconductor memory having local and global bit lines may be manufactured so that local bit lines are located on a different metal level than global bit lines. In a semiconductor memory having this type of architecture, the local bit lines are coupled to columns of memory cells in a memory array and the global bit lines are coupled to the local bit lines to provide bi-directional data communication. Generally, multiple select transistors are used to couple the local bit lines to the global bit lines. The select transistors form a multiplex circuit or select circuit that allows each global line to carry the signals of two or more local bit lines. During the manufacture of a wafer that contains local and global data lines, shorts can occur. If a short occurs, faulty data could be read into or read from the memory.

Generally, local and global bit lines are tested for short circuits by the use of checkerboard test programs. A checkerboard program can also be referred to alternate bit line program. A checkerboard test program detects short circuits by programming the cells in a memory array into certain patterns and then verifying the patterns in the global bit lines. Due to the positioning of local and global bit lines in the prior art, the use of a single checkerboard program to catch shorts in both the local and global bit lines is not possible.

Figure 2A:
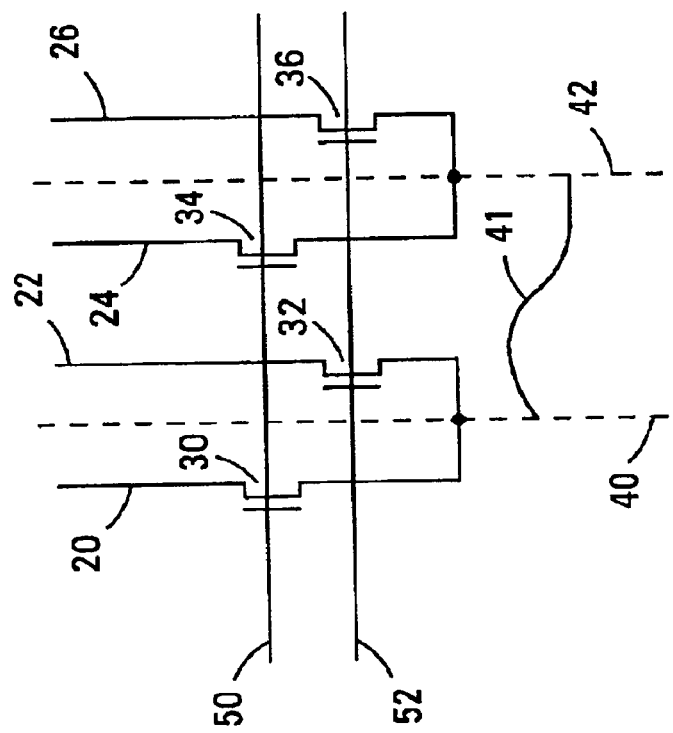
FIGS. 2 and 2A are illustrations of a prior art local and global bit line design.
Figure 2:
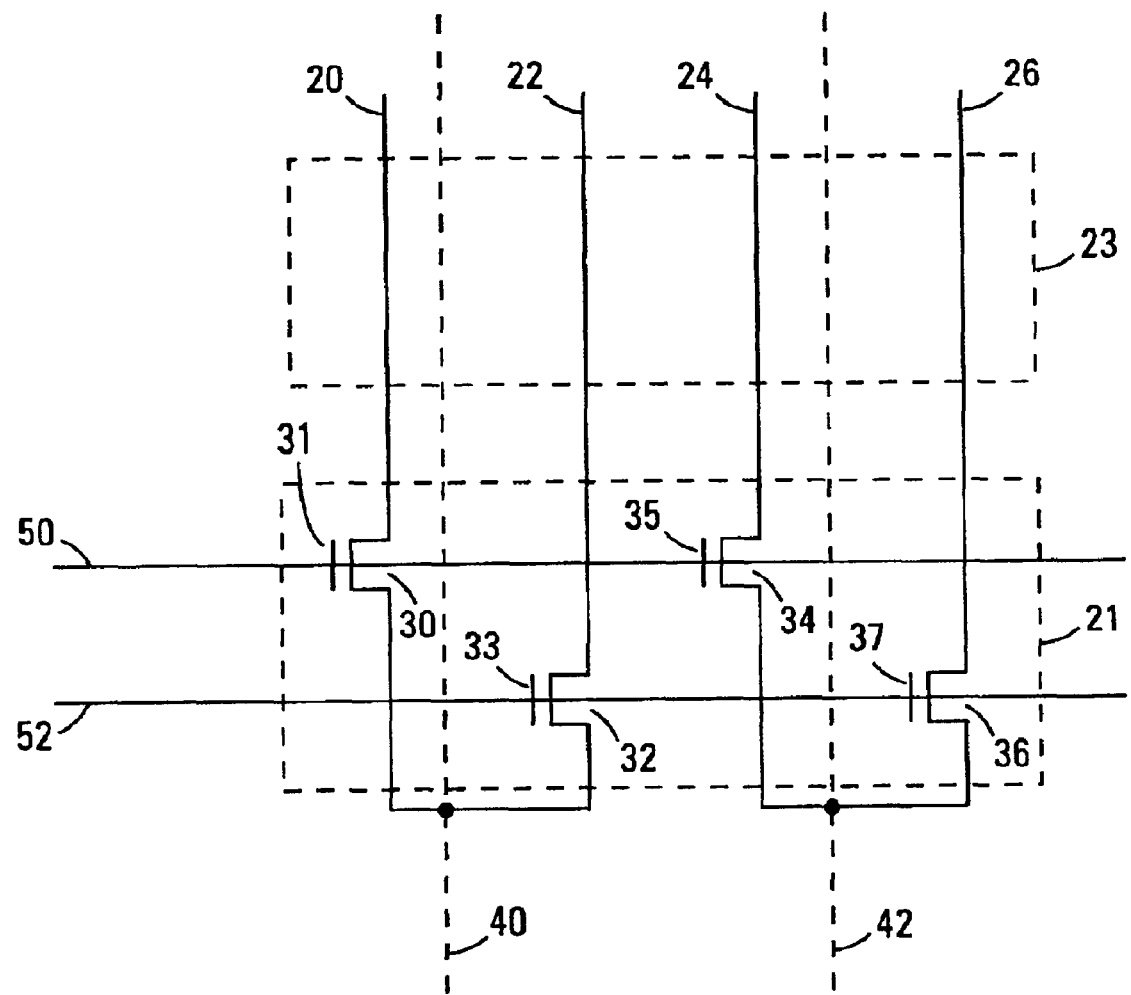

For example, a typical embodiment of local and global bit line architecture in the prior art is illustrated in FIG. 2. The prior art is illustrated having a first local bit line 20, a second local bit line 22, a third local bit line 24 and a fourth local bit line 26. The local bit lines 20, 22, 24 and 26 are positioned generally parallel with each other, ascending sequentially from the first local bit line 20 to the fourth local bit line 26. The prior art also includes a first select transistor 30, a second select transistor 32, a third select transistor 34 and a fourth select transistor 36. The select transistors form a multiplex circuit 21. As illustrated, the multiplex circuit 21 is positioned at one end of a memory array 23.

In the prior art, the first select transistor has a first control gate 31, the second transistor has a second control gate 33, the third transistor has a third control gate 35 and the fourth transistor has a fourth control gate 37. The circuit also includes a first global bit line 40, a second global bit line 42 as well as a first select line 50 and a second select line 52. The first select transistor 30 is coupled between the first local bit line 20 and the first global bit line 40. The first control gate 31 is coupled to the first select line 50. The second select transistor 32 is coupled between the second local bit line 22 and the first global bit line 40. The second control gate 33 is coupled to the second select line 52. Thus, the state of the first local bit line 20 is passed to the first global bit line 40 if the first select line 50 is activated. Moreover, the state of the second local line 22 is passed to the first global bit line 40 if the second select line 52 is activated.

The third select transistor 34 is coupled between the third local bit line 24 and the second global bit line 42. The third control gate 35 is coupled to the first select line 50. The fourth select transistor 36 is coupled between the fourth local date line 26 and the second global data line 42. The fourth control gate 37 is coupled to second select line 52. Thus, the state of the third local bit line 24 is passed to the second global bit line 42 if the first select line 50 is activated. Moreover, the state of the fourth local line 26 is passed to the second global bit line 42 if the second select line 52 is activated. It will be understood in the art that while only four local bits lines 20, 22, 24, and 26 and one multiplexer 21 are shown in FIG. 2, a memory array actually comprises many such bit lines and multiplexer circuits.

In a typical prior art, this type of memory is tested for bit line shorts by, first, starting from a blank field (all memory cells are conducting, or are said to be "on" or at a "high" state), then programming cells alternatively, to obtain the so-called "checkerboard" pattern, then reading this pattern to ensure its correctness. This yields an array with alternating "on" and "off" cells. Off cells can be referred to cells in a programmed or "low" state.

If two local bit lines are shorted together (for example bit lines 20 and 22 of FIG. 2), as bit line 20 is accessed for programming, the programming voltage will also reach, through the short, the adjacent bit line 22. Accordingly, memory cells coupled to bit line 20 and bit line 22 will be affected and possibly programmed. That is, the cell intended to be programmed, which is coupled to bit line 20, will be programmed (in an "off" or "low" state) and the cell coupled to bit line 22 will also be programmed (in an "off" or "low" state). In this example, had there not been short between the two bit lines 20 and 22, the cell coupled to bit line 22 would not be programmed. This type of bit line to bit line short is discovered with the "checkerboard" pattern with prior art architecture.

However, if the short is not on a local bit line itself but between global bit lines, the prior art architecture does not allow for its detection with a checkerboard pattern. For example, if a short 41 is between global bit lines 40 and 42 (as illustrated in FIG. 2A), when a cell coupled to bit line 20 is programmed short 41 will cause a cell coupled to bit line 24 to also be programmed. Since, the cell coupled to bit line 24 would be next to be programmed anyways to achieve the checkerboard pattern, short 41 will not be detected in the checkerboard pattern. That is, a checkerboard pattern of "on", "off", "on", "off" cells will still be read.

It will be appreciated that a similar result will happen during operations where the conductivity of each cell matters, such in a read operation. For example, if an "off" cell is read that is coupled to a bit line that is shorted to another bit line that is in turn coupled to a cell that is "on," the read operation will yield an "on" cell result.

Figure 1A:
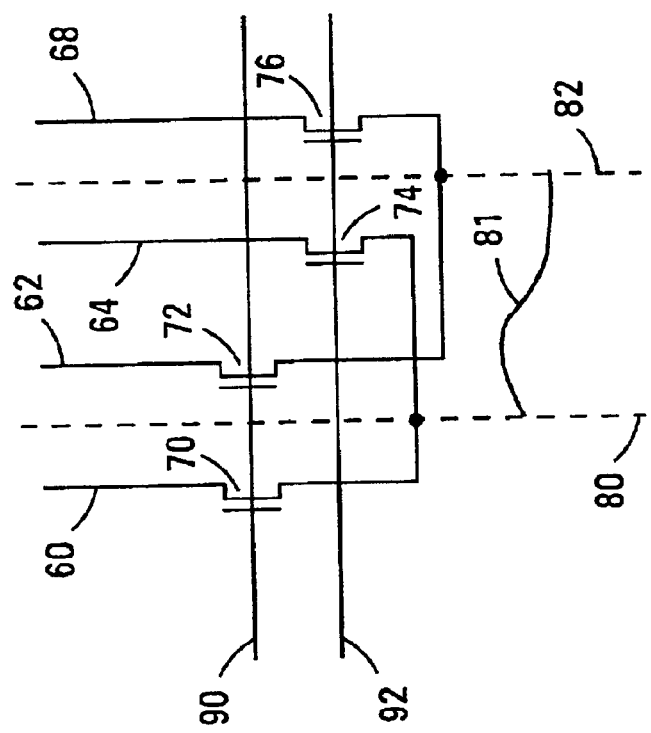

In the present invention, the same checkerboard pattern of alternating "on" and "off" cells are used to determine shorts. However, with the architecture of the embodiments of the present invention, local bit line shorts as well as global bit line shorts can be detected. An embodiment of the present invention is illustrated in FIG. 1. Referring to FIG. 1A, a global short 81 is illustrated in the embodiment of FIG. 1. As illustrated, if global bit lines 80 and 82 have a short 81, a programmed cell coupled to local bit line 60 would also program a cell coupled to bit line 62. The cell coupled to bit line 62 which should have been "on" in the checkerboard pattern will become "off" as the result of short 81. Accordingly, global line short 81 will be detected in the checkerboard pattern. The pattern will be "off", "off", "off", "off" memory cells. Accordingly, one benefit of the present invention is that all global bit line shorts can be detected by storing a single checkerboard pattern in the memory cells and then reading the memory cells.

Referring back to FIG. 1, this embodiment of the present invention includes a first local bit line 60 (X1), a second local bit line 62 (X2), a third local bit line 64 (X3) and a fourth local bit line 68 (X4). The local bit lines 60, 62, 64 and 68 are positioned generally parallel with each other ascending sequentially from the first local bit line 60 to the fourth local bit line 68. This embodiment also includes a first global bit line 80 (Y1) and a second global bit line 82 (Y2). In addition, the embodiment further includes a first select transistor 70, a second select transistor 72, a third select transistor 74 and a fourth select transistor 76. The select transistors form a multiplex circuit 61 or select circuit. The multiplex circuit 61 is positioned at one end of the memory array 63 as illustrated in FIG. 1.

The first select transistor 70 is coupled between the first local bit line 60 and the first global line 80. The second select transistor 72 is coupled between the second local bit line 62 and the second global bit line 82. The third select transistor 74 is coupled between the third local bit line 64 and the first global bit line 80. Moreover, the fourth select transistor 76 is coupled between the fourth local bit line 68 and the second global bit line.

In addition, the first transistor 70 has a first control gate 71, the second transistor 72 has a second control gate 73, the third transistor 74 has a third control gate 75 and the fourth transistor 76 has a 77 fourth control gate. A first select line 90 (Z1) and a second select line 92 (Z2) are used to activate control gates 71, 73, 75 and 77. The first select line 90 is coupled to the first control gate 71 and the second control gate 73. The second select line 92 is coupled to the third control gate 75 and the fourth control gate 77. Thus, when the first select line 60 is activated, the state of the first select line 60 is passed to the first global bit line 80 and the state of the second select line 62 is passed to the second global bit line 82. Moreover, when the second select line 92 is activated the state of the third local bit line 64 is passed to the first global bit line 80 and the state of the fourth local bit line 68 is passed to the second global bit line 82.

Another advantage of the embodiments of the present invention relate to a mode called "alternative bit line stress." This mode applies a voltage, or stress, across bit lines in order to detect possible leakage, oxide defects or other processing defects between bit lines. Referring to FIG. 2, in the prior art, a potential voltage difference can be applied to global bit lines 40 and 42 with activation signals on 50 and 52, resulting in a voltage difference between local bit lines 22 and 24, and 26 and a next adjacent bit line in an adjacent group of bit lines (not shown). However, with the architecture of the prior art there is no voltage difference between bit lines 20 and 22 or 24 and 26. Accordingly, only a partial bit line to bit line voltage stress can be applied.

Referring to FIG. 1, with the present invention, when a potential voltage difference is applied across global bit lines 80 and 82 with activation signals on 90 and 92, the voltage applied across 60 and 62, 62 and 64, 64 and 68, and 68 and a next bit line in an adjacent group of bit lines (not shown) will be different. This configuration provides for a complete, bit line to bite, voltage stress.

Figure 3:
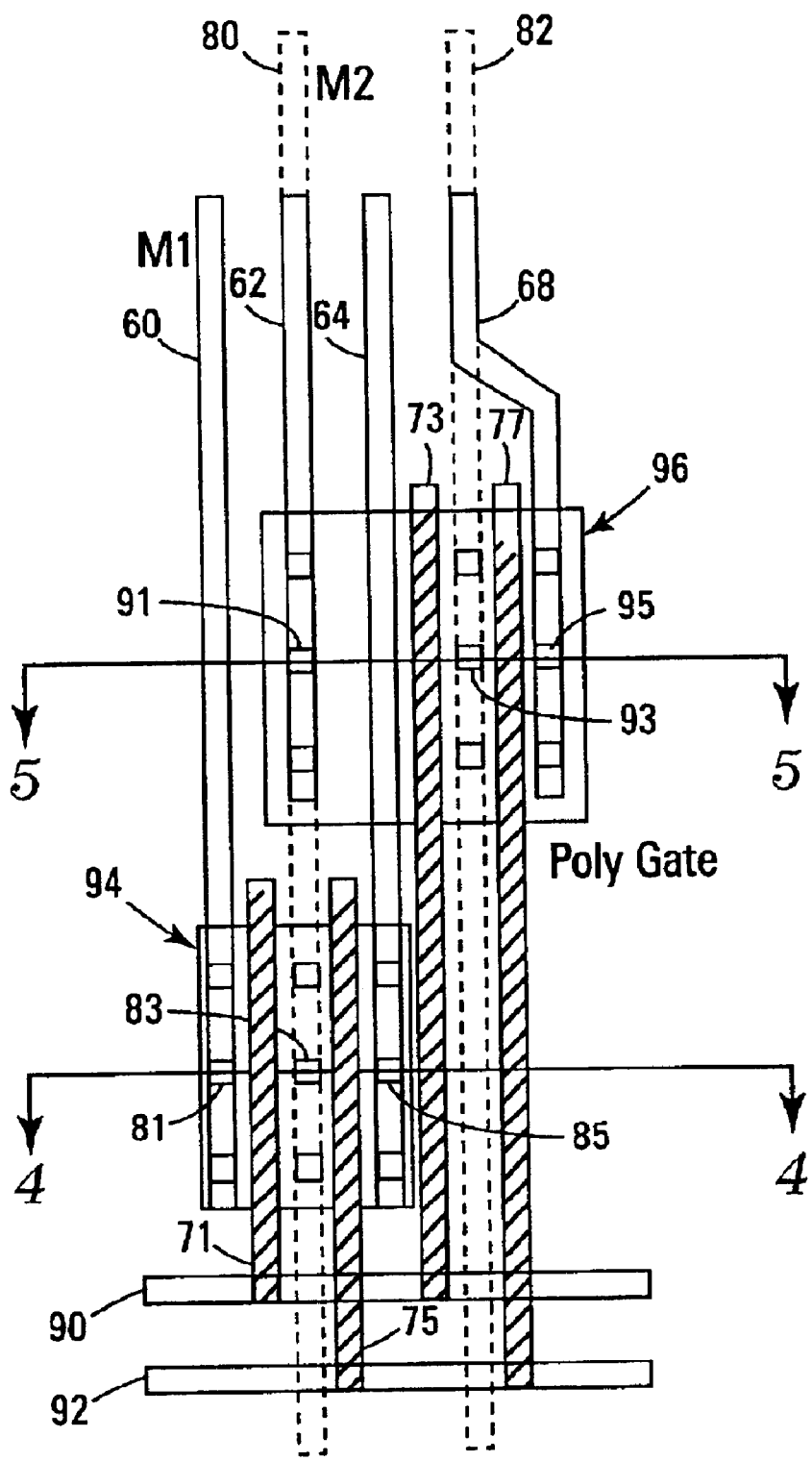
FIG. 3 is a plan view of one embodiment of the present invention.
Figure 4:
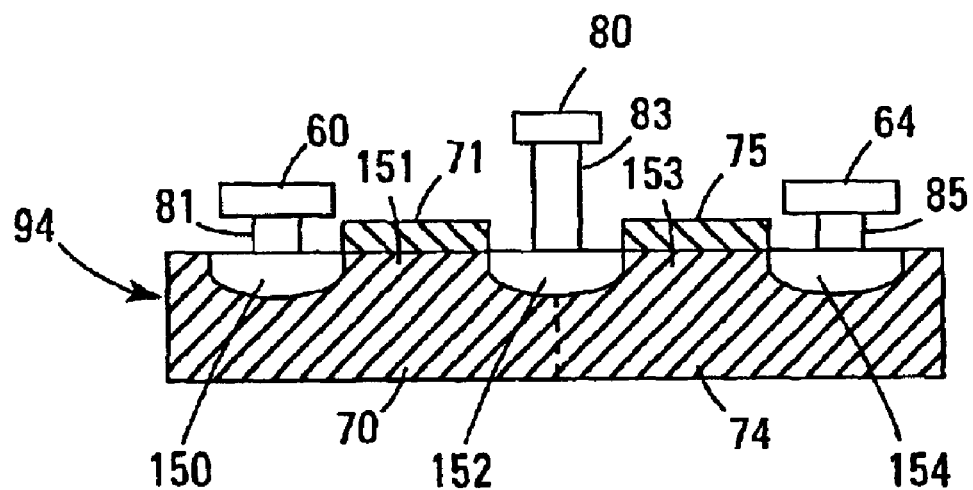
FIG. 4 is a cross-sectional view of the first active area of an embodiment of the present invention.

One possible physical layout of this embodiment is illustrated in the plan view of FIG. 3. As illustrated, the first local bit line 60, the third local bit line 64 and the first global bit line 80 are coupled to active area 94. Active area 94 includes the first select transistor 70 and the third select transistor 74, as illustrated in FIG. 4. FIG. 4 is a cross-sectional view of active area 94. The scale and spacing of FIG. 4 is not intended to be accurate, and is a simplified illustration to convey to those in the art the relevant elements of the embodiment. As illustrated, the first local bit line 60 is coupled to a first drain diffusion region 150 by contact 81, the first global bit line 80 is coupled to a source diffusion region 152 by contact 83 and the third local bit line 64 is coupled to a second drain diffusion area 154 by contact 85. The first control gate 71 is coupled to a first channel region 151 and the first select line 90 is coupled to the first control gate 71. The third control gate 75 is coupled to a second channel region 153 and the second select line 92 is coupled to the third control gate 75. As illustrated in FIG. 4, the first global bit line 80 is formed in metal layer that is a predetermined distance from a metal layer upon which the first and third local bit lines 60 and 64 are formed.

Figure 5:
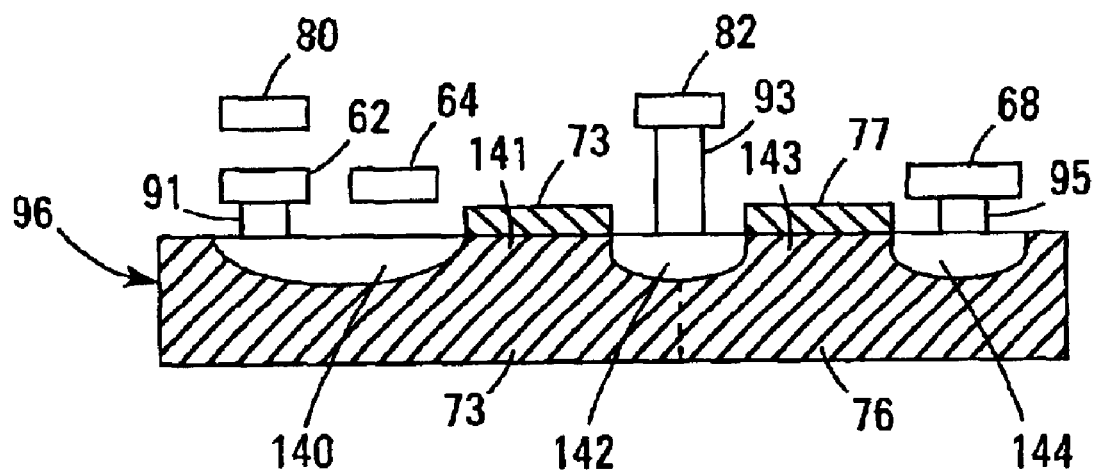
FIG. 5 is a cross sectional view of a second active area of an embodiment of the present invention.

As illustrated in FIG. 3, the second local bit line 62, the fourth local bit line 68 and the second global bit line 82 are coupled to active area 96. Active area 96 includes the second select transistor 73 and the fourth select transistor 76. FIG. 5 represents a cross-sectional view of the active area 96. The scale and spacing of FIG. 5 is not intended to be accurate, and is a simplified illustration to convey to those in the art the relevant elements of the embodiment. The second local bit line 62 is coupled to a first drain diffusion region 140 by contact 91, the second global bit line 82 is coupled to a source diffusion region 142 by contact 93 and the fourth local bit line 68 is coupled to a second drain diffusion region 144 by contact 95. As illustrated in FIG. 5, the area of the first drain diffusion region 140 is widened to allow the third local bit line 64 to be positioned between the second local bit line 62 and the second global bit line 82. Moreover, as illustrated, local bit line 64 is not coupled to the source diffusion region 140. FIG. 5 also illustrates the positioning of the first global bit line 80 with relation to the second local bit line 62. The first global bit line 80 is formed in a same metal layer as the second global bit line 82.

In addition, the second control gate 73 in active area 96 is coupled to a first channel region 141. The first channel region 141 is located between the first drain diffusion region 140 and the source diffusion region 142. The first select line 90 is coupled to the second control gate 73. The fourth control gate 77 is coupled to a second channel region 143. The second channel region 143 is located between the source diffusion region 142 and the second drain diffusion region 144. The second select line 92 is coupled to the fourth control gate 77.

Figure 6:
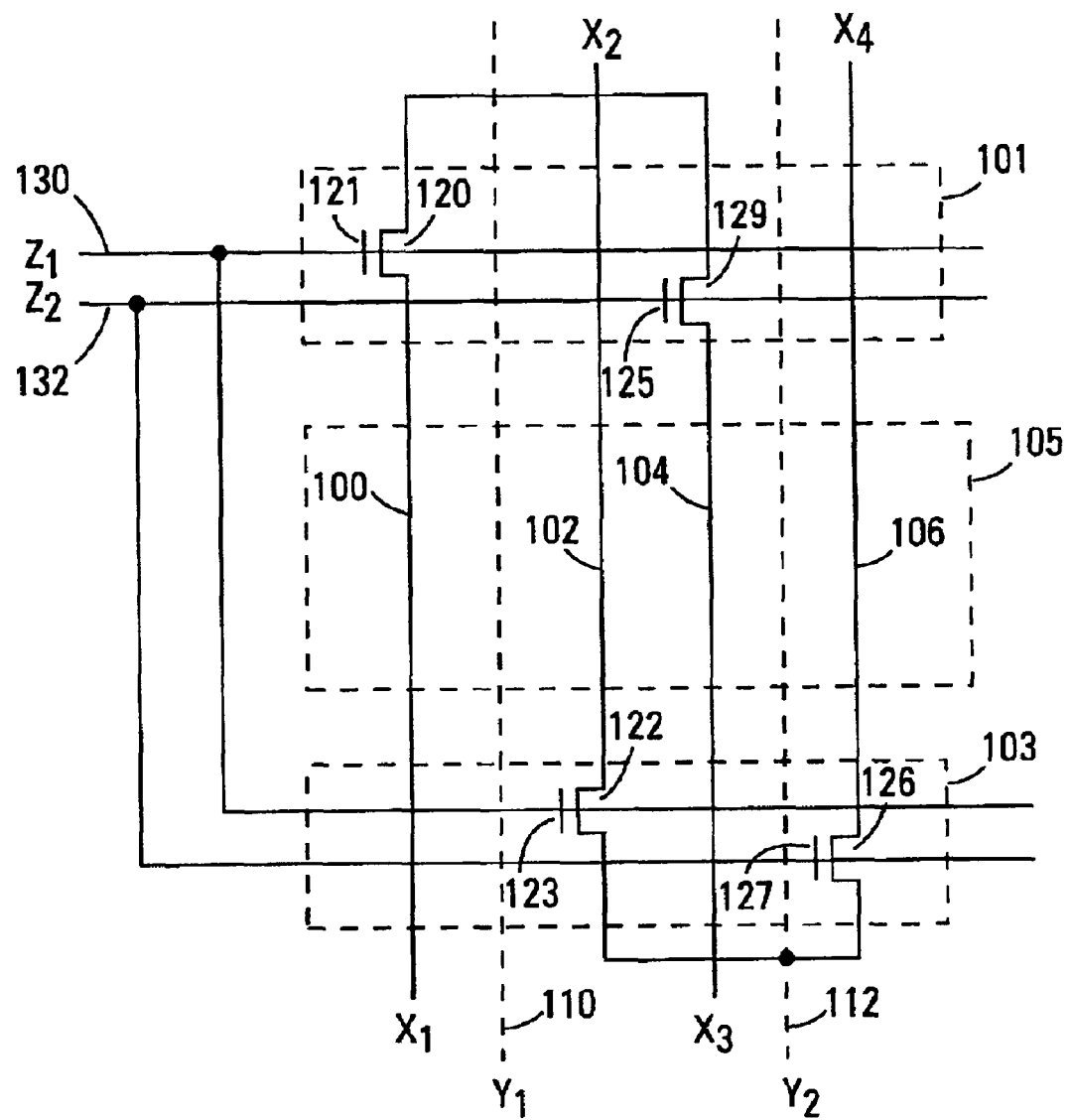
FIG. 6 is an illustration of another embodiment of the present invention using two multiplex circuits.

In another embodiment, the multiplex circuit, or select circuit, is split into a first multiplex circuit 101 and a second multiplex circuit 103 as illustrated in FIG. 6. In this embodiment, a memory array 105 is located between the first multiplex circuit 101 and the second multiplex circuit 103. As illustrated, the embodiment includes a first local bit line 100 (X1), a second local bit line 102 (X2), a third local bit line 104 (X3) and a fourth local bit line 106 (X4). The local bit lines 100, 102, 104 and 106 are positioned generally parallel with each other ascending sequentially from the first local bit line 100 to the fourth local bit line 106. This embodiment also includes a first select transistor 120, a second select transistor 122, a third select transistor 124 and a fourth select transistor 126. The first multiplex circuit 101 includes the first select transistor 120 and the third select transistor 120. The second multiplex circuit 103 includes the second select transistor 122 and the fourth select transistor 126. In addition, this embodiment further includes a first global bit line 110 (Y1) and a second global bit line 112 (Y2).

The first select transistor 120 is coupled between the first local bit line 100 and the first global bit line 110. The second select transistor 122 is coupled between the second local bit line 102 and the second global bit line 112. The third select transistor 124 is coupled between the third local bit line 104 and the first global bit line 110. Moreover, the fourth select transistor 126 is coupled between the fourth local bit line 106 and the second global bit line 112. In addition, the first select transistor 120 has a first control gate 121, the second select transistor 122 has a second control gate 123, the third select transistor 124 has a third control gate 125 and the fourth select transistor 126 has a fourth control gate 127. A first select line 130 (Z1) and a second select line 132 (Z2)are used to activate the control gates 121, 123, 125 and 127. The first select line 130 is coupled to the first control gate 121 and the second control gate 123. The second select line 132 is coupled to the third control gate 125 and the fourth control gate 127.

As with the previous embodiment, a pattern of alternating "High" or "Low" states can also be achieved in the global bit lines 110 and 112 of this embodiment by the use of an alternate bit line stress program. For example, by placing a "Low" state on local bit line 100, a "High" state on local bit line 102, a "Low" state on local bit line 104 and a "High" state on line 106 an alternate pattern of "Low", "High", "Low", "High" pattern is achieved in the global bit lines. Moreover, this embodiment also allows shorts between the local bit lines and shorts between global bit lines to both be detected in the checkerboard pattern. Thus, only one checkerboard program is needed.

It will be appreciate by those skilled in the art that the placement of the select transistors can very with memory designs and the present invention is not limited to placing the select transistors in one or more particular areas of the die. Moreover, the previous embodiments of the present invention have been illustrated with only four local bit lines and two global bit lines, it will be appreciate by those skilled in the art that the number of local bit lines and the number of global bit lines can very with memory designs and that the present invention is not limited to four local bit lines and two global bit lines.

Figure 7:
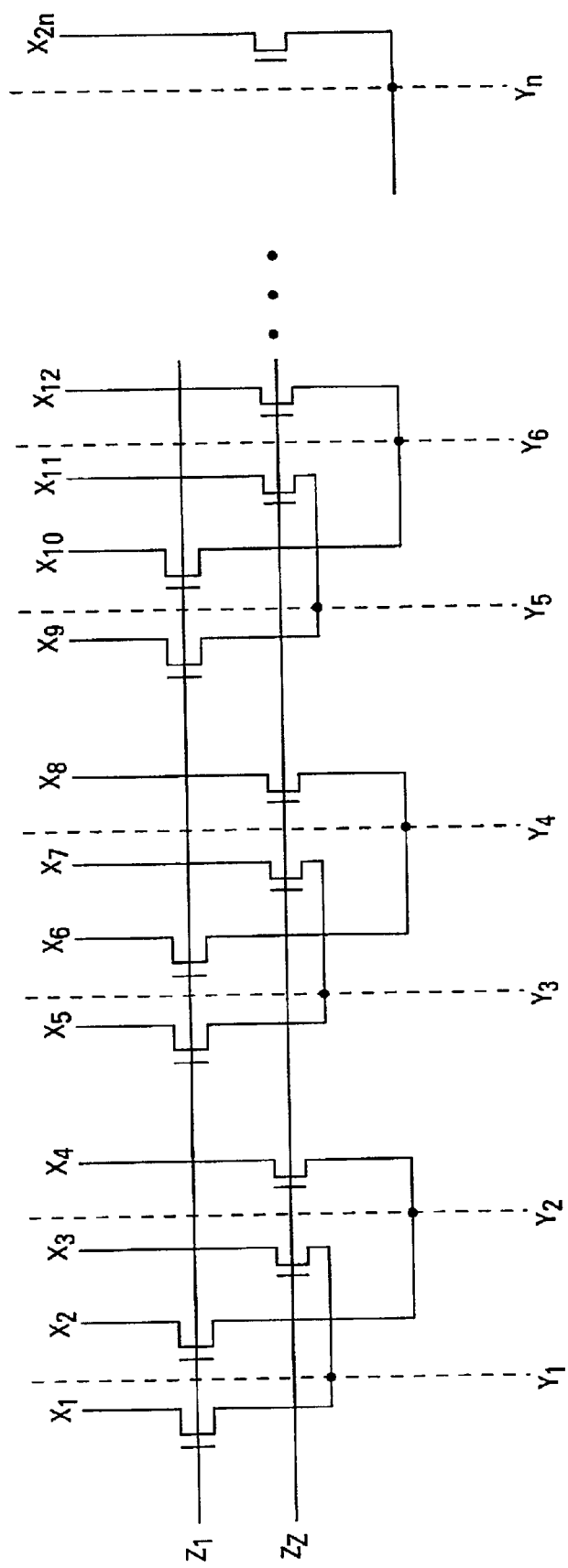
FIG. 7 is an illustration of an embodiment having multiple sets of local and global bit lines and two select lines of the present invention.

For example, an embodiment using a first and second select line and multiple sets of four local and two global bit lines is illustrated in FIG. 7. In this embodiment, the number of global bit lines can be expressed as Y1 through Yn. Moreover, the number of local bit lines can be expressed as X1 through X2n. In this embodiment sets of four sequentially number local bit lines are coupled to associated pairs of global bit lines. For example, the odd global bit line Y1 is coupled to two sequentially ascending odd numbered local bit lines X1 and X3 and the even global bit line Y2 is coupled to two sequentially ascending even number local bit lines X2 and X4. The first select line Z1 is coupled to a control gates on transistors coupled to X1andX2, X5 and X6, X9 and X10 . . . etc. The second select line Z2 is coupled to a control gates on transistors coupled to X3 and X4, X7 and X8, X11 and X12 . . . etc.

Figure 8:
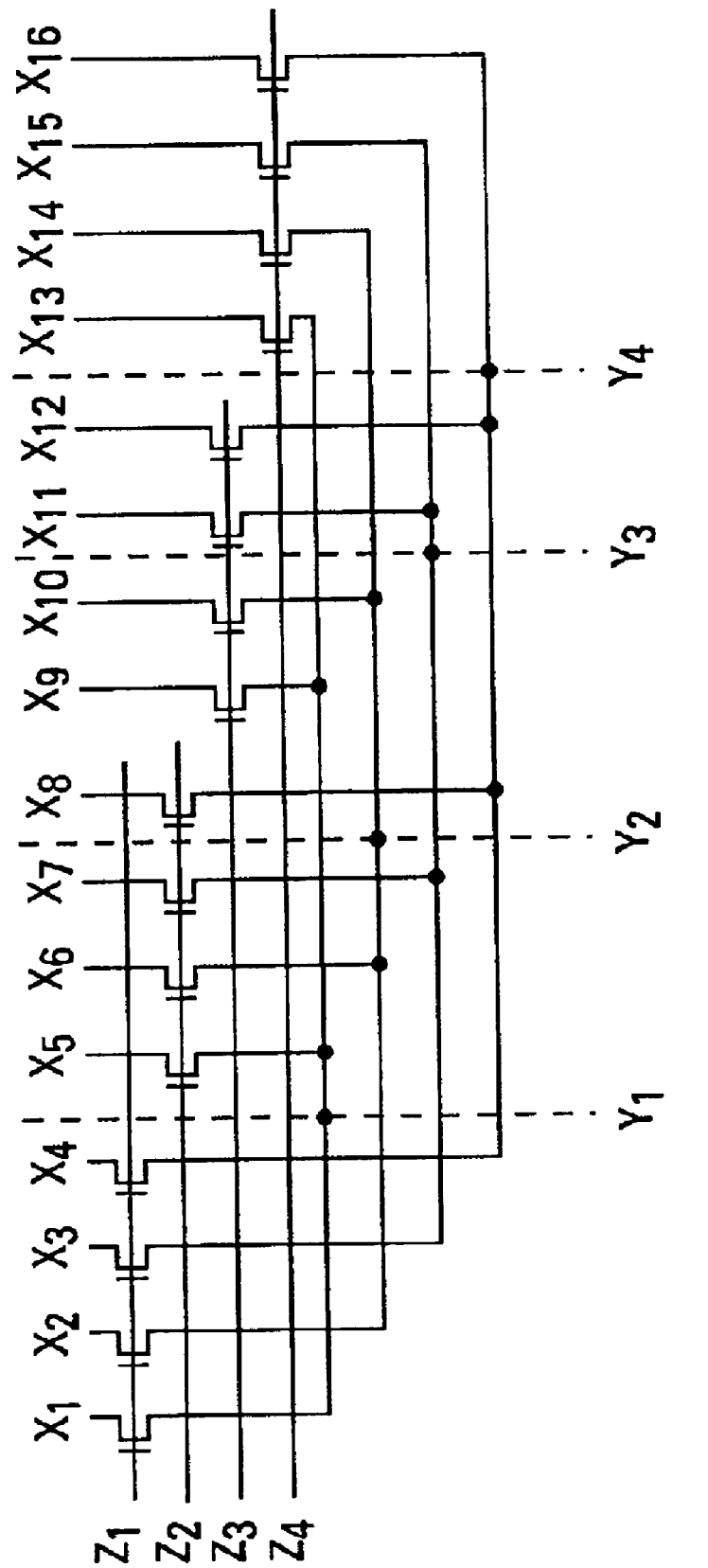
FIG. 8 is an illustration of another embodiment of the present invention.

In other embodiments of the present invention, more than two local bit lines are coupled to a single global bit line. In these embodiments, an even number of local bit lines are coupled to each global bit line to ensure that the alternate bit line stress will work as previously described. For example, an embodiment is illustrated in FIG. 8. As illustrated in FIG. 8, local bit lines X1, X5, X9 and X13 are selectively coupled to global bit line Y1, local bit lines X2, X6, X10 and X14 are selectively coupled to global bit line Y2, local bit lines X3, X7, X11 and X15 are selectively coupled to global bit line Y3 and local bit lines X4, X8, X12 and X16 are selectively coupled to global bit line Y4. In this embodiment one global bit line is coupled to four associated local bit lines. In addition, as illustrated in FIG. 8 and as illustrated in FIG. 1, embodiments of the present invention can be described as coupling odd local bit lines to odd global bit lines and even local bit line to even global bit lines wherein as, illustrated in FIGS. 1 and 8, the local and global bit lines are positioned essentially parallel with each other and are sequentially numbered. For example, referring to FIG. 8, local bit line X1 is coupled to global bit line Y1, local bit line X2 is coupled to global bit line Y2, local bit line X3 is coupled to global bit line Y3, local bit line X4 is coupled to global bit line Y4, local bit line X5 is coupled to global bit line Y1 . . . etc.

CONCLUSION

A flash memory device that has a global and local bit line design that enables an alternate bit line stress mode as well as a way to detect short circuits in both the local and global bit lines with a single alternate bit line program. The flash memory device has a plurality of sets of adjacent local bit lines, a plurality of global bit lines and a plurality of select transistors. Each select transistor has a control gate and is coupled between one of the local bit lines in each set of local bit lines and one of the global bit lines. Thus, each local bit line in each set of local bit lines is coupled to a different global bit line. Multiple select lines are used to activate the control gates on the select transistors. Each select line is coupled to the control gates on associated select transistors. The associated select transistors are select transistors that are coupled to the local bit lines in an associated set of local bit lines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:
   a plurality of sets of adjacent local bit lines;
   a plurality of global bit lines; and
   a plurality of select transistors each having a control gate, each select transistor is coupled between one of the local bit lines in each set of local bit lines and one of the global bit lines, wherein a first global bit line of the plurality of global bit lines is coupled to the select transistors of non-adjacent local bit lines.

2. The flash memory device of claim 1 further comprising:
   a plurality of select lines to activate the control gates on the select transistors, each select line is coupled to the control gates on associated select transistors, wherein the associated select transistors are select transistors that are coupled to the local bit lines in an associated set of local bit lines.

3. The flash memory device of claim 1 wherein each set of local bit lines comprises two or more local bit lines.

4. The flash memory device of claim 1 wherein each set of local bit lines contains an even number of bit lines.

5. The flash memory device of claim 1, further comprising:
a plurality of select lines to activate the control gates on the select transistors, each select line is coupled to the control gates on associated select transistors, wherein the associated select transistors are select transistors that are coupled to every other global bit line.

6. The flash memory device of claim 1 wherein each set of local bit lines comprises four local bit lines.

7. The flash memory device of claim 1, wherein the plurality of global bit lines comprises two global bit lines.

8. A flash memory device comprising:
a plurality of local bit lines positioned generally parallel with each other;
a plurality of select transistors, each transistor coupled to an associated one of the plurality of local bit lines; and
a plurality of global bit lines, each global bit line is coupled to a pair of associated select transistors, wherein the pair of select transistors are associated with alternate local bit lines.

9. The flash memory device of claim 8 wherein the device is manufactured so the local bit lines are on a different planer level than the global bit lines.

10. A flash memory system comprising:
an array of flash memory cells arranged in rows and columns;
a plurality of local bit lines positioned generally parallel with each other, each local bit line is coupled to an associated column of the memory array;
a plurality of global bit lines; and
a select circuit to selectively couple the local bit lines to the global bit lines, wherein a first global bit line of the plurality of global bit lines is coupled to non-adjacent local bit lines.

11. The flash memory system of claim 10 wherein the plurality of local bit lines comprise a first local bit line, a second local bit line, a third local bit and a fourth local bit line.

12. The flash memory system of claim 10 wherein the select circuit comprises a select transistor coupled to each of the plurality of bit lines.

13. A method of forming an integrated circuit comprising:
selectively coupling select transistors between a local bit line in a set of local bit lines and an associated global bit line, wherein each non-adjacent local bit line in the set of local bit lines is coupled to a first global bit line; and
selectively coupling a select line to control gates of the select transistors coupled to the local bit lines in a set of local bit lines.

14. The method of claim 13, wherein each set of local bit lines contains an even number of bit lines.

15. A flash memory device comprising:
a plurality of sets of adjacent local bit lines, each set comprising a first, second, third, and fourth local bit line;
a plurality of global bit lines including a first and a second global bit line; and
a plurality of select transistors each having a control gate, the plurality of select transistors are coupled between the plurality of sets of adjacent local bit lines and the plurality of global bit lines, wherein every other local bit line in one of the plurality of sets of local bit lines is coupled to a different one of the plurality of global bit lines such that the first global bit line is coupled to the first and third local bit lines and the second global bit line is coupled to the second and fourth local bit lines.

16. A flash memory device comprising:
a plurality of sets of adjacent local bit lines, each set comprising a first, second, third, and fourth local bit line;
a plurality of global bit lines including a first and a second global bit line;
a plurality of select transistors each having a control gate, the plurality of select transistors are coupled between the plurality of sets of adjacent local bit lines and the plurality of global bit lines, wherein the first global bit line is coupled to the first and third local bit lines and the second global bit line is coupled to the second and fourth local bit lines;
a first select line coupled to control gates of select transistors coupled to the first and second local bit lines; and
a second select line coupled to control gates of select transistors coupled to the third and fourth local bit lines.

17. A flash memory device comprising:
a plurality of local bit lines positioned generally parallel with each other, the plurality of local bit lines include a first local bit line, a second local bit line, a third local bit and a fourth local bit line;
a plurality of select transistors coupled to an associated one of the plurality of local bit lines;
a plurality of global bit lines, each global bit line is coupled to a pair of associated select transistors, wherein the pair of select transistors are coupled to alternate local bit lines;
a first select line coupled to control gates of the select transistors coupled to the first and second local bit lines; and
a second select line coupled to control gates of the select transistors coupled to the third and fourth local bit lines.

18. A flash memory device comprising:
a plurality of local bit lines positioned generally parallel with each other wherein the local bit lines are formed on a first metal level;
a plurality of select transistors coupled to an associated one of the plurality of local bit lines; and
a plurality of global bit lines, each global bit line is coupled to a pair of associated select transistors, wherein the pair of select transistors are coupled to alternate local bit lines and the global bit lines are formed on a second metal level.

19. A flash memory system comprising:
an array of flash memory cells arranged in rows and columns;
a plurality of local bit lines positioned generally parallel with each other, each local bit line is coupled to an associated column of the memory array;
a plurality of global bit lines; and
a select circuit to selectively couple the local bit lines to the global bit lines, wherein every other local bit line is coupled to a different global bit line, the select circuit comprising a first select line to activate select transistors that are coupled to the first and second local bit lines and a second select line to activate select transistors that are coupled to the third and fourth local bit lines.

* * * * *